(12) United States Patent
Yamashita et al.

(10) Patent No.: US 10,559,343 B1
(45) Date of Patent: *Feb. 11, 2020

(54) MEMORY DEVICE WITH A SIGNAL CONTROL MECHANISM

(71) Applicant: Micron Technology, Inc., Boise, ID (US)

(72) Inventors: Akira Yamashita, Sagamihara (JP); Kenji Asaki, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/508,162

(22) Filed: Jul. 10, 2019

Related U.S. Application Data (63) Continuation of application No. 16/041,480, filed on Jul. 20, 2018, now Pat. No. 10,438,650.

(51) Int. Cl.
*G11C 11/4076* (2006.01)
*G11C 11/4093* (2006.01)

(52) U.S. Cl.
CPC ...... *G11C 11/4076* (2013.01); *G11C 11/4093* (2013.01)

(58) Field of Classification Search
CPC .................. G11C 11/4076; G11C 11/4093
USPC ......................................... 365/194
See application file for complete search history.

(56) References Cited

U.S. PATENT DOCUMENTS

| | | | |
|---|---|---|---|
| 2008/0098253 A1* | 4/2008 | Lee ................. | G01R 31/31937 713/503 |
| 2016/0248405 A1 | 8/2016 | Bailey | |
| 2018/0166110 A1* | 6/2018 | Ku ......................... | G11C 7/222 |

* cited by examiner

*Primary Examiner* — Fernando Hidalgo
(74) *Attorney, Agent, or Firm* — Perkins Coie LLP (57) ABSTRACT

A memory device includes an internal storage unit configured to store mode data specifying an operating speed of the memory device; a control decoder coupled to the internal storage unit, the control decoder configured to generate a delay control signal based on the mode data; and an input buffer coupled to the control decoder, the input buffer configured to adjust a delay of an input signal based on the delay control signal.

20 Claims, 7 Drawing Sheets

MEMORY DEVICE WITH A SIGNAL CONTROL MECHANISM

CROSS-REFERENCE TO RELATED APPLICATIONS

This application is a continuation of U.S. application Ser. No. 16/041,480, filed Jul. 20, 2018, which is incorporated herein by reference in its entirety.

TECHNICAL FIELD

The disclosed embodiments relate to memory devices, and, in particular, to memory devices with a signal control mechanism.

BACKGROUND

Memory systems can employ memory devices to store and access information. The memory devices can include volatile memory devices, non-volatile memory devices, or a combination device. Memory devices, such as dynamic random-access memory (DRAM), can utilize electrical energy to store and access data. For example, the memory devices can include Double Data Rate (DDR) RAM devices that implement DDR interfacing scheme for high-speed data transfer.

For some memory devices (e.g., DDR RAM devices), certain signals are timing critical. For example, column address (CA) signal, chip select (CS) signal, clock (CK) signal, etc. need to be processed simultaneously. Internal to the memory devices, the CK signal and the CA/CS signals arrive at the corresponding latches at the same time to be successfully latched.

With technological advancements in other areas and increasing applications, the market is continuously looking for faster, more efficient, and smaller devices. To meet the market demand, the semiconductor devices are being pushed to the limit. As the devices are pushed to the limit, processing times for timing critical signals decrease, which increases timing-related errors and/or processing difficulties. In view of the ever-increasing commercial competitive pressures, along with growing consumer expectations and the desire to differentiate products in the marketplace, it is increasingly desirable that answers be found to these problems. Additionally, the need to reduce costs, improve efficiencies and performance, and meet competitive pressures adds an even greater pressure to find answers to these problems.

DETAILED DESCRIPTION

As described in greater detail below, the technology disclosed herein relates to memory devices, systems with memory devices, and related methods for controlling internal delays of timing critical signals. The memory devices (e.g., the DRAM devices) can include a timing decoder that process one or more outputs (e.g., a delay-skip signal configured to allow the device to bypass one or more internal delays) from a mode register. For certain operational modes (e.g., intermediate operating speed mode), the timing decoder and/or the mode register can process the delay-skip signal and further bypass one or more delays in the chip select (CS) input buffer, column address (CA) input buffer, etc.

At full speed of DRAM operation (e.g., 4.3 Gbps), full power can be applied to both the CA/CS input buffer and the CK input buffer in some embodiments. Internal delay circuits in each of these two buffers can be configured to have comparable delays so that signals from the CK and the CA/CS arrive at the CsLatch and CaLatch substantially at the same time to be successfully latched. At low speed of DRAM operation (e.g., 1.6 Gbps), reduced power can be applied to both the CA/CS input buffer and the CK input buffer. Because of the reduced power applied (to both input buffers), the delay is increased in both buffers, proportionally, such that signals from the CK and the CA/CS arrive at the CsLatch and CaLatch at the same time to be successfully latched. However, at the intermediate speed of DRAM operation (e.g., 3.2 Gbps), power is reduced to only the CA/CS input buffer, but power may not be reduced to the CK input buffer. Accordingly, without any adjustments, the CA/CS input buffer experiences an increased propagation delay, but the CK input buffer does not, such that CK signals arrive sooner at the CsLatch/CaLatch than the corresponding CS and CA signals. The differences in the propagation delay can fail at this mode and result in reduced yield. Such failure can be prevented by controlling the delays in the CA/CS input buffers based on the delay-skip signal (e.g., corresponding to the timing decoder and/or the mode register).

Figure 1:
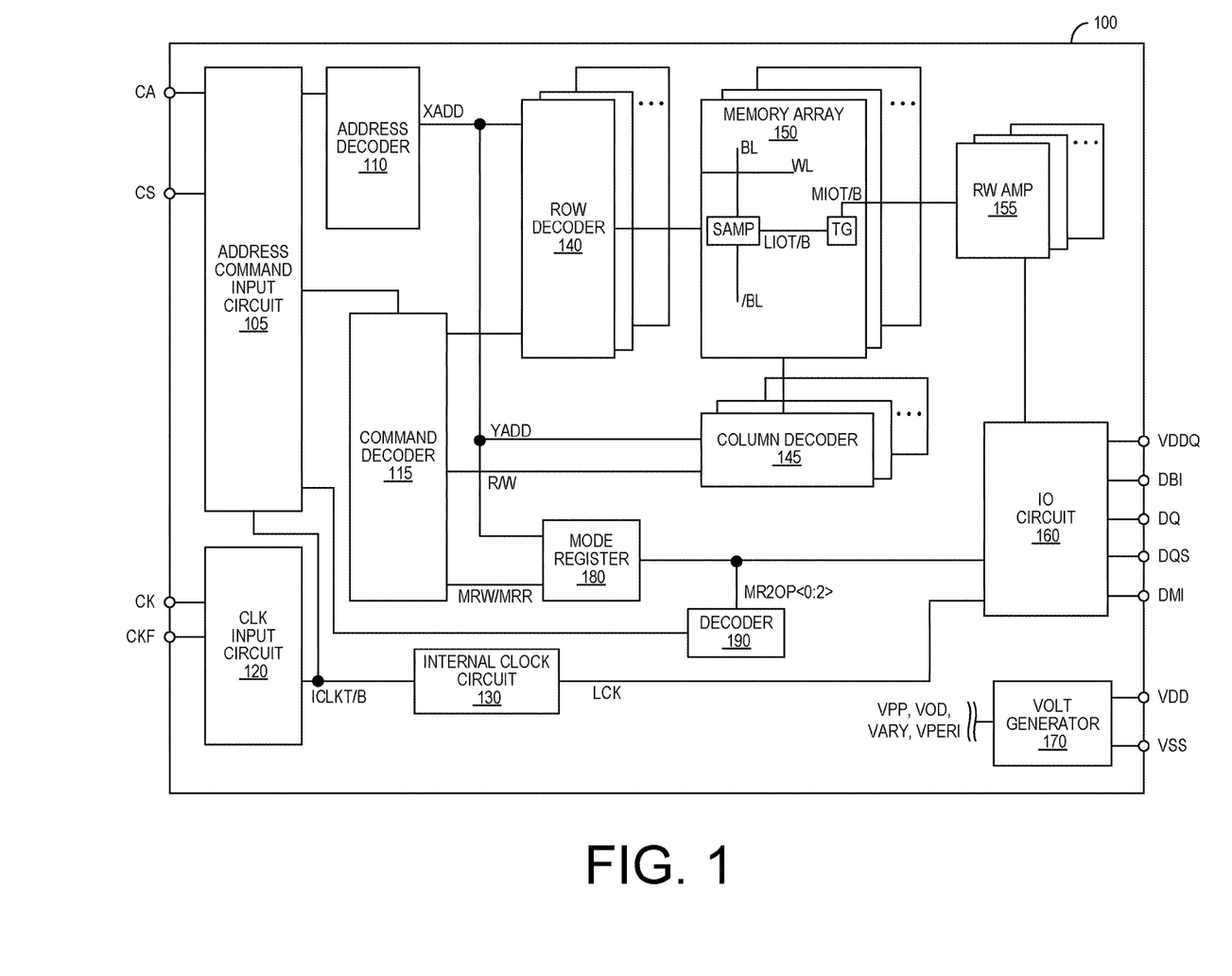
FIG. 1 is a block diagram of a memory device in accordance with an embodiment of the present technology.

FIG. 1 is a block diagram of a memory device (e.g., a semiconductor memory device 100, such as a DRAM device) in accordance with an embodiment of the present technology. The memory device 100 may include a plurality of banks (e.g., banks 0-15 in the example of FIG. 1) that each includes an array of memory cells, such as memory array 150. Within the memory banks, each memory array may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals CMD and address signals ADDR, respectively. The memory device may further include a chip select terminal to receive a chip select signal (CS), clock terminals to receive clock signals CK and CKF, data and data related terminals DQ, DQS, DBI, and DMI, power supply terminals VDD, VSS, VDDQ, and VSSQ.

The command and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (not shown) to select one of the plurality of banks.

The command and address terminals may be supplied with command signals CMD, address signals ADDR, and CS, from a memory controller. The command signals may represent various memory commands from the memory controller (e.g., including access commands, which can include read commands and write commands). CS may be used to select the memory device 100 to respond to commands and addresses provided to the command and address terminals. When an active CS is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ via read/write amplifiers 155 and the input/output circuit 160 with the RDQS clock, DBI and DMI signals. The read data may be provided at a time defined by read latency information (RL) that can be programmed in the memory device 100, for example, in a mode register 180. The RL can be defined in terms of clock cycles of the CK clock signal. For example, the RL (e.g., MR2OP<2:0>) can be a number of clock cycles of the CK signal after the read command is received by the memory device 100 when the associated read data is provided. Also, the RL can correspond to an operating frequency, such as a high frequency setting (e.g., 4.3 Gbps), a low frequency setting (e.g., 1.6 Gbps), an intermediate frequency setting (e.g., 3.2 Gbps), etc. Similar to the RL, write latency information (WL) that can be programmed in the memory device 100, for example in the mode register 180 and be defined in terms of clock cycles of the CK clock signal and can correspond to the operating frequency.

Unlike the high frequency setting and the low frequency setting, the intermediate frequency setting can introduce an unbalanced propagation delay between the clock and CA/CS signals. For example, at full speed of DRAM operation (e.g., 4.3 Gbps), full power can be applied to both the CA/CS input buffer and the CK input buffer. Internal delay circuits in each of these two buffers can be configured to have comparable delays so that signals from the CK and the CA/CS arrive at the CsLatch and CaLatch at substantially the same time to be successfully latched. Also, at low speed of DRAM operation (e.g., 1.6 Gbps), reduced power is applied to both the CA/CS input buffer and the CK input buffer. Because of the reduced power applied (to both input buffers), the delay is increased in both buffers, proportionally, such that signals from the CK and the CA/CS arrive at the CsLatch and CaLatch substantially at the same time to be successfully latched. However, at the intermediate speed of DRAM operation (e.g., 3.2 Gbps), power is reduced to only the CA/CS input buffer and not reduced to the CK input buffer. Accordingly, the CK circuit path and the CA/CS circuit path would introduce different propagation delays, such that signals from the CK would arrive at the latches at a different time (e.g., earlier) than signals from the CA/CS.

The memory device 100 can further include an operation-speed decoder 190 configured to control the RL. The operation-speed decoder 190 can be configured to decode/identify the operating frequency, and in response, control/bypass one or more delays to control the RL. For example, for the intermediate frequency setting, the operation-speed decoder 190 can generate a delay-bypass signal. Based on the delay-bypass signal, the memory device 100 can bypass one or more delays in communicating the CA/CS signals. As such, using the operation-speed decoder 190 and the generated delay-bypass signal, the memory device 100 can reduce/eliminate the difference/unbalance in the propagation delay between the CK circuit path and the CA/CS circuit path. Based on bypassing one or more delays in the CA/CS input buffer, the CA/CS signals can arrive at the latches at substantially the same time as the CK signal, which can decrease failures and yield reductions caused by uneven arrival of the signals.

When a write command is issued and a row address and a column address are timely supplied with the command, write data can be supplied to the data terminals DQ, DBI, and DMI. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, can be supplied to a clock input circuit 120. The CK and CKF signals can be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal (not shown) from the command decoder 115, an input buffer can receive the CK and CKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired.

The memory device 100 can be connected to any one of a number of memory devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

Figure 2:
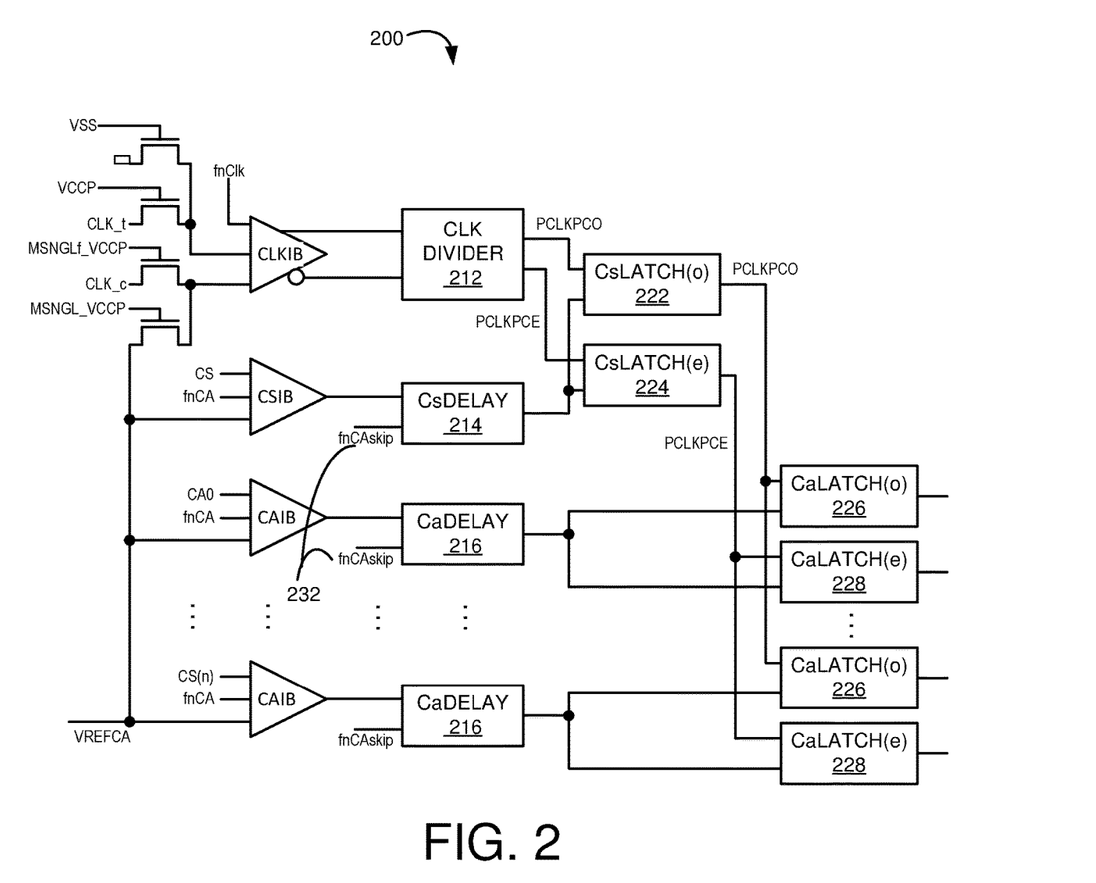
FIG. 2 is a block diagram of an example clock tree circuit in accordance with an embodiment of the present technology.

FIG. 2 is a block diagram of an example clock tree circuit 200 (e.g., ADDRESS COMMAND INPUT CIRCUIT 105 of FIG. 1 or a portion thereof) in accordance with an embodiment of the present technology. The clock tree circuit 200 can represent circuit paths utilized to receive and latch input data (e.g., CS, CA<n:0>, etc.).

The clock tree circuit 200 can include buffers configured to receive input data. For example, the clock tree circuit 200 can include a CLK input buffer (CLKIB), a CS input buffer (CSIB), a set of CA input buffers (CAIB), etc. The CLKIB can receive one or more clock signals (e.g., CLK_t, CLK_c, etc.) through one or more switches that operate according to power levels/status. The CSIB and the CAIBs can receive the corresponding CS data and the CA data from the pads.

The clock tree circuit 200 can include a clock divider 212 connected to the output of the CLKIB. The clock divider 212 can generate clock outputs (e.g., divided frequencies of the input clock signal), such as a first/odd clock output (PCLK-PCO), a second/even clock output (PCLKPCE), etc. The clock outputs can be provided to one or more latches in the clock tree circuit 200.

The clock tree circuit 200 can include a CS delay 214 along with one or more CA delays 216 (e.g., corresponding to a set of CA(0) to CA(n)). In some embodiments, the clock tree circuit 200 can include one delay component for the CS delay 214 and six or more delay components for the CA delays 216.

After the delay, the CA and CS signals can be provided to corresponding latches. The clock tree circuit 200 can include one or more CS latches (e.g., a first CS latch 222, a second CS latch 224, etc.) and/or one or more CA latches (e.g., a first set of CA latches 226, a second set of CA latches 228, etc.). For example, the first/odd CS latch 222 can latch the CS data according to the first/odd clock output, and the second/even CS latch 224 can latch the CS data according to the second/even clock output. Also, the first/odd set of CA latches 226 can latch the CA data according to the first/odd clock output, and the second/even set of CA latches 228 can latch the CA data according to the second/even clock output.

The clock tree circuit 200 can further include a mechanism (e.g., circuit configuration) configured to control the RL (e.g., propagation delay of the CS and/or the CA signal), such as using a delay-control signal 232 (fnCAskip). For example, the memory device 100 (e.g., the address/command input circuit 105, the command decoder 115, the mode register 180, etc.) can be controlled independently based on an operating speed for the memory operations. Based on the operating speed (e.g., values in the mode register 180), the decoder 190 of FIG. 1 can generate the delay-control signal 232. The clock tree circuit 200 (e.g., the address/command input circuit 105) can receive the delay-control signal 232, such as at the CS delay 214 and/or the CA delays 216. Based on the delay-control signal 232 (e.g., when the operating speed is the intermediate operating speed), the clock tree circuit 200 can be configured to bypass one or more of the delays according to the delay-control signal 232. In some embodiments, the clock tree circuit 200 (e.g., at the CS delay module 214 and/or the CA delay modules 216) can include a switch that connects the circuit path to a delay component or a parallel bypass path (e.g., an electrical conductor/short) according to the delay-control signal 232.

Figure 3A:
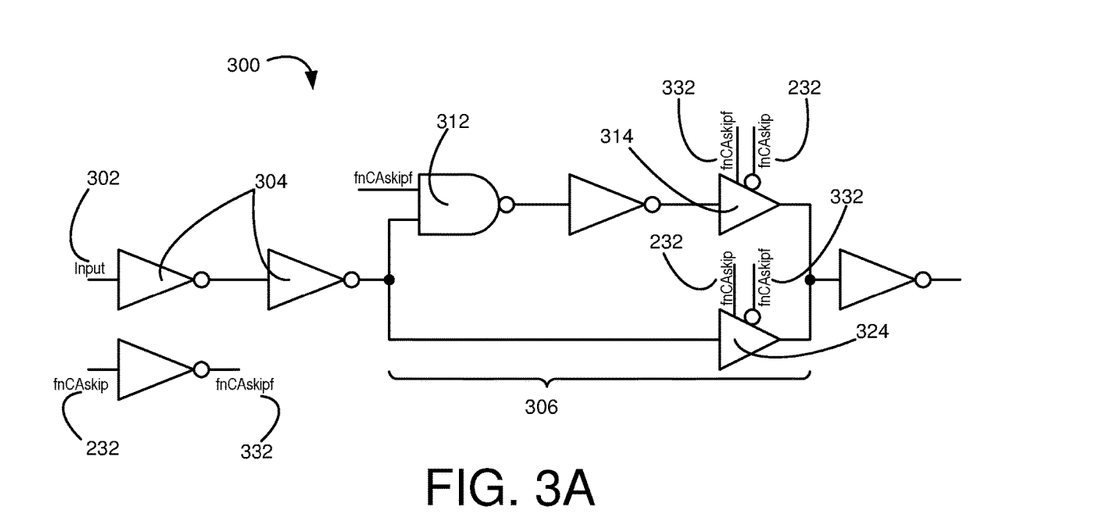
FIG. 3A is a block diagram of an example input buffer in accordance with an embodiment of the present technology.

FIG. 3A is a block diagram of an example input buffer 300 in accordance with an embodiment of the present technology. The input buffer 300 can include one or more buffers/inverters 304 configured to receive and process an input signal 302 (e.g., the CS signal, the CA signal, etc.). For example, the input buffer 300 can include the CS buffer, the CA buffer, the CS delay 214 of FIG. 2, the CA delays 216 of FIG. 2, a portion thereof, or a combination thereof.

Traditionally, the CS/CA input buffers can include a series of buffers (e.g., inverters). For example, traditional CS/CA input buffers can include a set (e.g., five) inverters connected in series. Accordingly, the traditional CS/CA input buffers provide a processing delay/propagation delay consistent with the series of buffers.

Unlike the traditional design, the input buffer 300 can be configured to vary the amount of delay applied to the input signal 302. The input buffer 300 can vary the amount of delay according to the delay-control signal 232 (fnCAskip). For example, the input buffer 300 can include a selection circuit 306 configured to select a number of buffers/inverters that is used to process the input signal 302. The selection circuit 306 can include two or more branches that each include different amounts and/or configurations of circuit components (e.g., inverters, selection gate, such as a NAND gate, etc.).

In some embodiments, the selection circuit 306 can include a first circuit path/branch (e.g., a top portion/path as shown in FIG. 3A) that includes a first-path selection gate 312, one or more first-path delays, a first-path output buffer 314. The selection circuit 306 can further include a second circuit path/branch (e.g., a bottom portion/path as shown in FIG. 3A) that is parallel to the first circuit path. The second circuit path can include a fewer number of circuit components and provide lesser propagation delay than the first circuit path. For example, the second circuit path can include a second-path output buffer 324. The second circuit path can be without any additional selection gate and/or delays.

In controlling propagation of the input signal 302 through the circuit paths, the selection circuit 306 can use the delay-control signal 232 and/or an inverted bypass signal 332 (e.g., opposite of the delay-control signal 232). In some embodiments, the first-path selection gate 312 can include a NAND gate that is configured to receive and process the input signal 302 or a derivation thereof according to the inverted bypass signal 332. Also, the first-path output buffer 314 and/or the second-path output buffer 324 can be configured to process the input signal 302 or a derivation thereof according to the delay-control signal 232 and/or an inverted bypass signal 332. The first-path output buffer 314 and the second-path output buffer 324 can be configured to process an incoming signal (e.g., the derivation of the input signal 302) according to opposing values of the delay-control signal 232 and/or an inverted bypass signal 332. For example, the first-path output buffer 314 can process the incoming signal according to an inverted value of the delay-control signal 232 and/or the inverted bypass signal 332, and the second-path output buffer 324 can process the incoming signal according to the delay-control signal 232 and an inverted value of the inverted bypass signal 332.

Based on the selection circuit 306, the input buffer 300 can provide a first propagation delay for the input signal 302 through the top branch/portion. The selection circuit 306 can provide the first propagation delay when the delay-control signal 232 is not active, such as when the operating speed is set to high or low. Also, the input buffer 300 can provide a second propagation delay, which is shorter/less than the first propagation delay, for the input signal 302 through the bottom branch/portion. The selection circuit 306 can provide the second propagation delay when the delay-bypass signal 232 is active, such as when the operating speed is set to intermediate. Accordingly, the selection circuit 306 can bypass one or more delays using the delay-bypass signal 232 and match the propagation of the CA/CS signal to that of the CK signal.

Figure 3B:
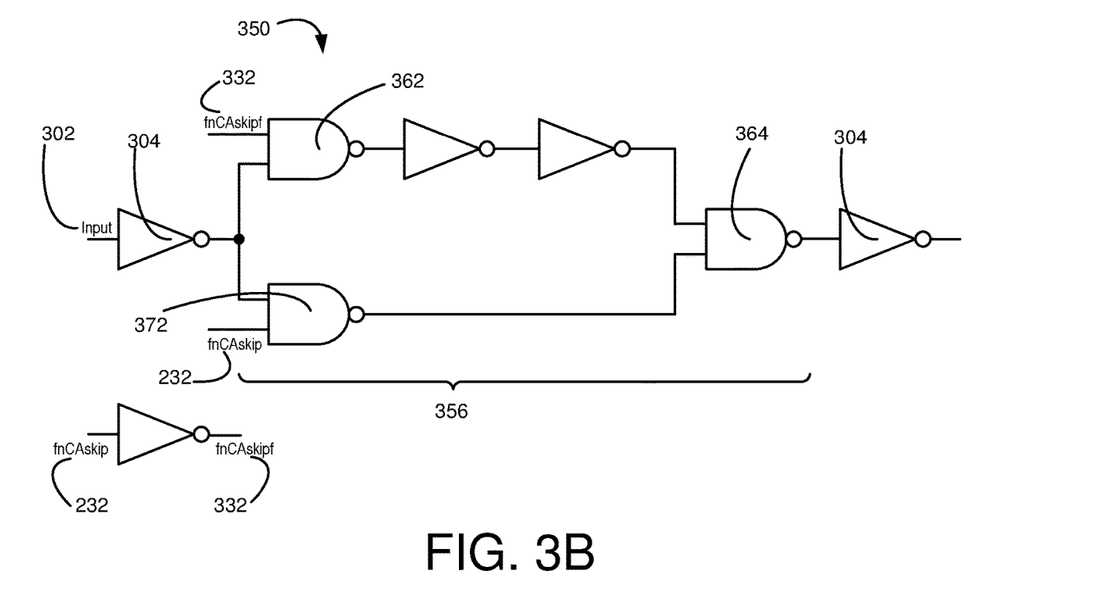
FIG. 3B is a block diagram of an example input buffer in accordance with a further embodiment of the present technology.

FIG. 3B is a block diagram of an example input buffer 350 in accordance with a further embodiment of the present technology. The input buffer 350 can include one or more of the buffers/inverters 304 configured to receive and process the input signal 302 (e.g., the CS signal, the CA signal, etc.). For example, the input buffer 350 can include the CS buffer, the CA buffer, the CS delay 214 of FIG. 2, the CA delays 216 of FIG. 2, a portion thereof, or a combination thereof.

Similar to the input buffer 300, the input buffer 350 can be configured to vary the amount of delay applied to the input signal 302. For example, the input buffer 300 can include a selection circuit 356 configured to select a number of buffers/inverters that is used to process the input signal 302. The selection circuit 356 can include two or more branches that each include different amounts and/or configurations of circuit components (e.g., inverters, selection gate, such as a NAND gate, etc.). In some embodiments, the selection circuit 356 can include a first circuit path/branch (e.g., a top portion/path as shown in FIG. 3B) and a second circuit path/branch (e.g., a top portion/path as shown in FIG. 3B) parallel to the first circuit path/branch.

In some embodiments, the selection circuit 356 can include a first-path selection gate 362 (e.g., a NAND gate) and/or one or more first-path delays in the first circuit path and a second-path selection gate 372 (e.g., a NAND gate) in the second circuit path. The selection circuit 356 can further include an output control gate 364 (e.g., a NAND gate) that generates an output (e.g., a processing output of the input signal 302) based on signals from both the first circuit path and the second circuit path.

The first-path selection gate 362 and the second-path selection gate 372 can both receive and process an incoming signal (e.g., the input signal 302 or a processing result thereof). The first-path selection gate 362 and the second-path selection gate 372 can further process the incoming signal according to opposing signals. For example, the first-path selection gate 362 can process the incoming signal according to the inverted bypass signal 332, and the second-path selection gate 372 can process the incoming signal according to the delay-control signal 232. The output of the first-path selection gate 362 can further be processed using the one or more first-path delays and then routed to the output control gate 364. The output of the second-path selection gate 372 can be routed directly to the output control gate 364. The second circuit path can include a fewer number of circuit components and provide lesser propagation delay than the first circuit path. For example, the second circuit path can include the second-path selection gate 372 without any additional selection gate and/or delays.

Accordingly, the input buffer 350 can provide a first propagation delay for the input signal 302 through the top branch/portion and a second propagation delay through the bottom branch/portion. The second propagation delay can be shorter/less than the first propagation delay. The selection circuit 356 can provide the first propagation delay when the delay-control signal 232 is not active, such as when the operating speed is set to high or low, and provide the second propagation delay when the delay-bypass signal 232 is active, such as when the operating speed is set to intermediate. Accordingly, the selection circuit 306 can bypass one or more delays using the delay-bypass signal 232 and match the propagation of the CA/CS signal to that of the CK signal.

Figure 4:
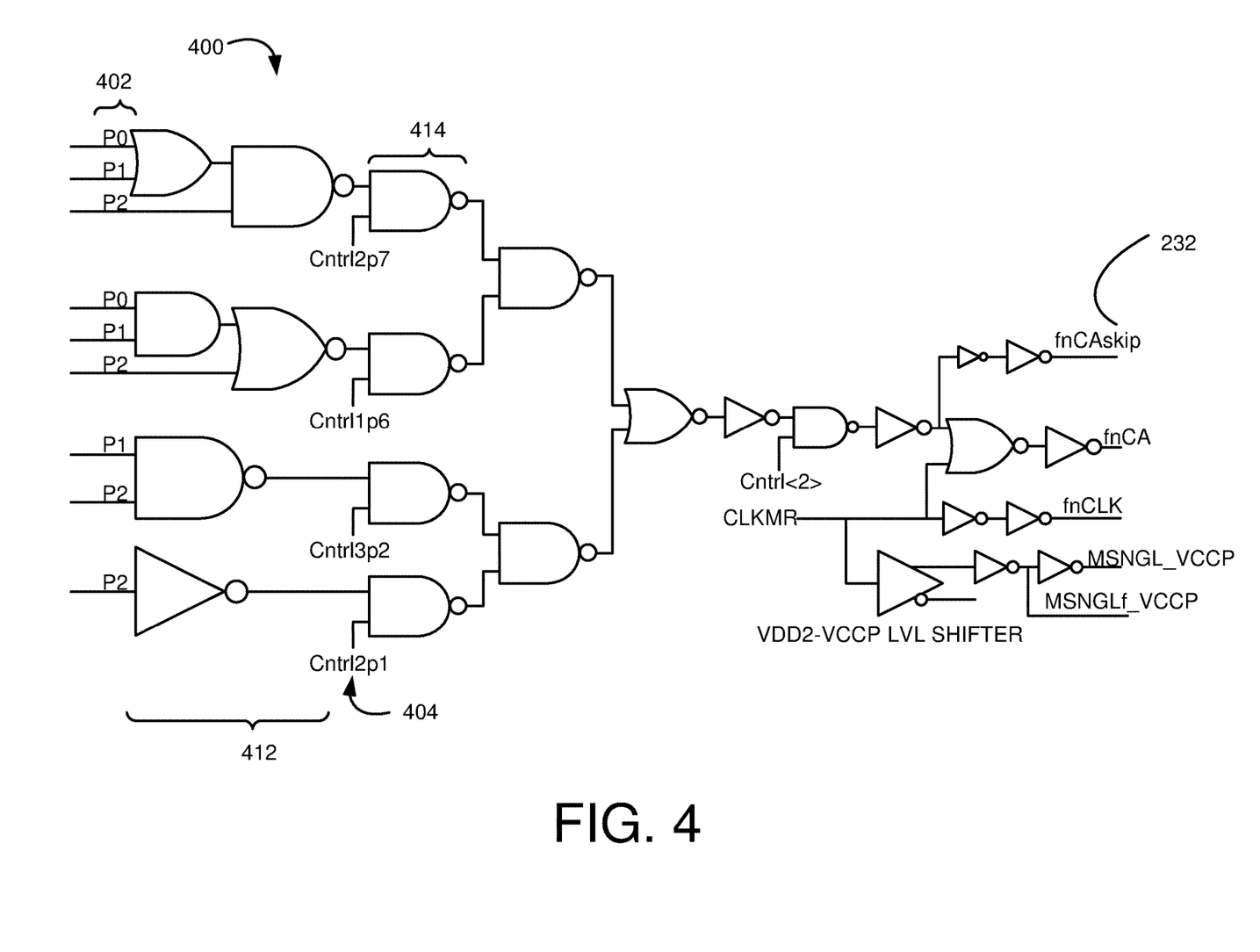
FIG. 4 is a block diagram of an example control decoder circuit in accordance with an embodiment of the present technology.

FIG. 4 is a block diagram of an example control decoder circuit 400 (e.g., the decoder 190 of FIG. 1 or a portion thereof) in accordance with an embodiment of the present technology. The control decoder circuit 400 can be configured to generate the delay-control signal 232. In some embodiments, the control decoder circuit 400 can generate other control signals (e.g., fnCA, fnCLK, VCCP, level shifter, etc.) along with the delay-control signal 232. The control decoder circuit 400 can generate the delay-control signal 232 based on receiving/accessing and processing a DRAM mode data 402, such as values stored in the mode register 180 of FIG. 1 and/or a fuse array. In some embodiments, the DRAM mode data 402 can include three bits (e.g., P0, P1, and P2 or MR2 op[2:0]) that represent the operating speed of the memory device 100 of FIG. 1. As such, the DRAM mode data 402 can correspond to the RL or WL.

Using the control decoder circuit 400, the decoder 190 can process the DRAM mode data 402 according to a clock speed adjustment. For example, the clock speed of the intermediate mode may be modified, either by values in the mode register 180 (e.g., if approved by JEDEC as a spec change) or in the fuse array, such that the medium speed/frequency is a different value (e.g., 2.7 Gbps, 2.1 Gbps, etc.). The control decoder circuit 400 or the decoder 190 can take into account the modifications to the medium speed in determining whether to assert the delay-control signal 232.

In some embodiments, the control decoder circuit 400 can include a first set of components (e.g., a receiving circuit 412 including one or more logic gates, such as AND/OR/NAND/NOR/inverter, etc.) configured to process the individual bits of the DRAM mode data 402. The outputs of the receiving circuit 412 can be provided as inputs to a second set of components (e.g., a trim control circuit 414 including one or more logic gates, such as NAND gates). The trim control circuit 414 can be configured to process the DRAM mode data 402 according to a speed adjustment data 404 (Cntrl2p7, Cntrl1p6, Cntrl3p2, Cntrl2p1, etc.) that represents the speed modification.

In some embodiments, the control decoder circuit 400 can process the DRAM mode data 402 and generate the delay-control signal 232 according to an RL control/enable data (Cntrl<2>). In some embodiments, the control decoder circuit 400 can process the DRAM mode data 402 and generate the other control signals according to the delay-control signal 232 and a clock status that represents whether or not the CLK signal is single ended. For example, CLKMR represents whether or not the CLK signal is single ended. When CLKMR takes high, MSNGL_VCCP is controlled to take high and CLKIB in FIG. 2 is controlled to receive VREFCA as a reference voltage, that is a single end operation. And when CLKMR takes low, MSNGLf_VCCP is controlled to take high and CLKIB in FIG. 2 is controlled to receive CLK_c as a differential clock signal, that is a differential operation.

Figure 5:
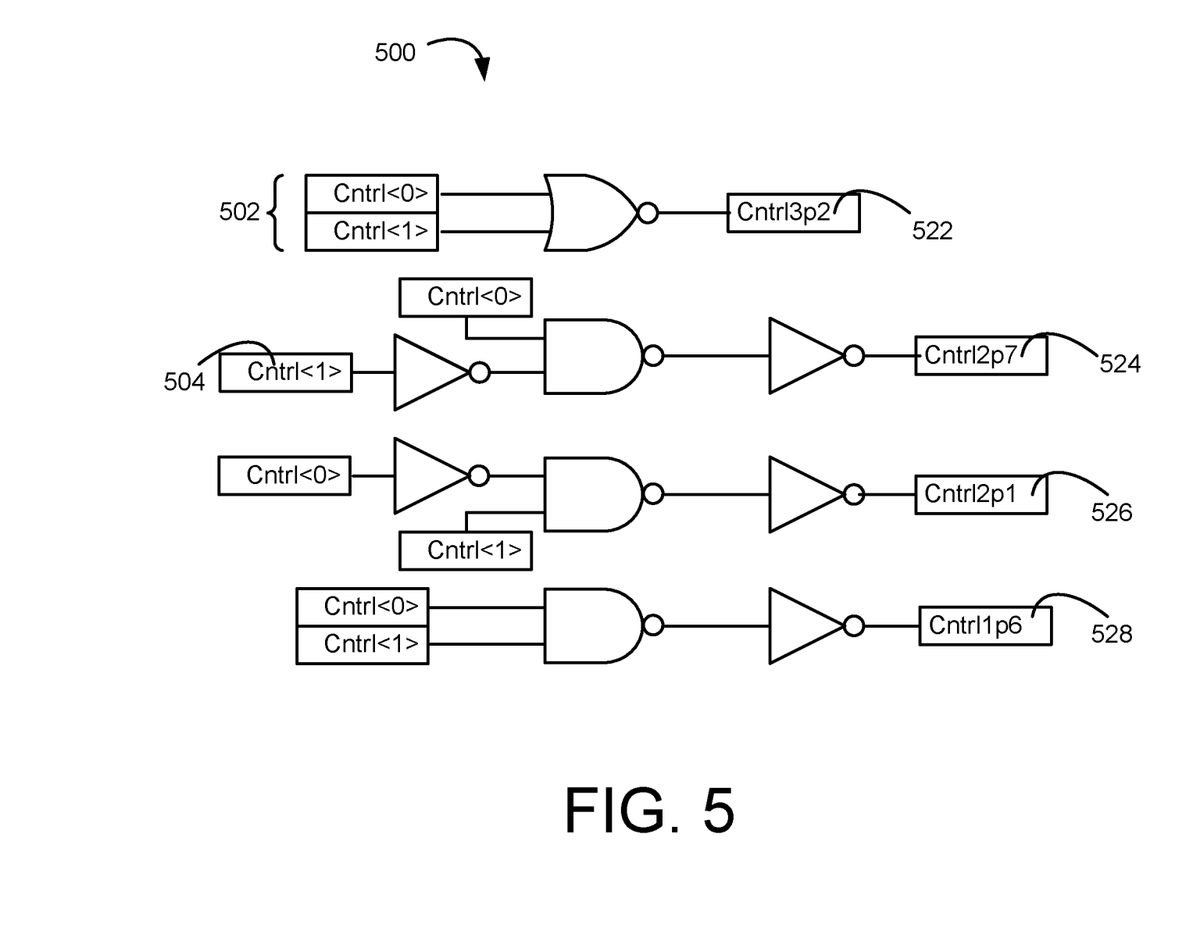
FIG. 5. is a block diagram of an example boundary control circuit in accordance with an embodiment of the present technology.

FIG. 5. is a block diagram of an example boundary control circuit 500 in accordance with an embodiment of the present technology. The boundary control circuit 500 can be configured to generate the speed adjustment data 404 based on processing an RL boundary control data 502. In some embodiments, the boundary control data 502 can include two bits (e.g., Cntrl<1:0>). The generated speed adjustment data 404 can be provided as inputs to the control decoder circuit 400 of FIG. 4, such as at the trim control circuit 414 of FIG. 4.

The boundary control circuit 500 can process the boundary control data 502 using a set of circuitry components. For example, the boundary control circuit 500 can include logic gates, such as inverters, ANDs, ORs, NANDs, NORs, etc. In some embodiments, the boundary control circuit 500 can generate the speed adjustment data 404 including a first adjustment value 522 (Cntrl3P2), a second adjustment value 524 (Cntrl2p7), a third adjustment value 526 (Cntrl2p1), a fourth adjustment value 528 (Cntrl1p6), etc. Each value of the speed adjustment data 404 can correspond to uniquely processing or combining the boundary control data 502, such as by inputting the boundary control data 502 to a unique combination of logic gates. For example, as illustrated in FIG. 5, the first adjustment value 522 can correspond to applying a NOR operation to the boundary control data 502. Also, the second adjustment value 524 can correspond to inverting Cntrl<1> and then applying a NAND operation to the inverted result and Cntrl<0>. Similarly, the third adjustment value 526 can correspond to inverting Cntrl<0> and then applying a NAND operation to the inverted result and Cntrl<1>. The fourth adjustment value 528 can correspond to applying a NAND operation to the boundary control data 502. In some embodiments, the NAND gates can each be followed by inverter.

Figure 6:
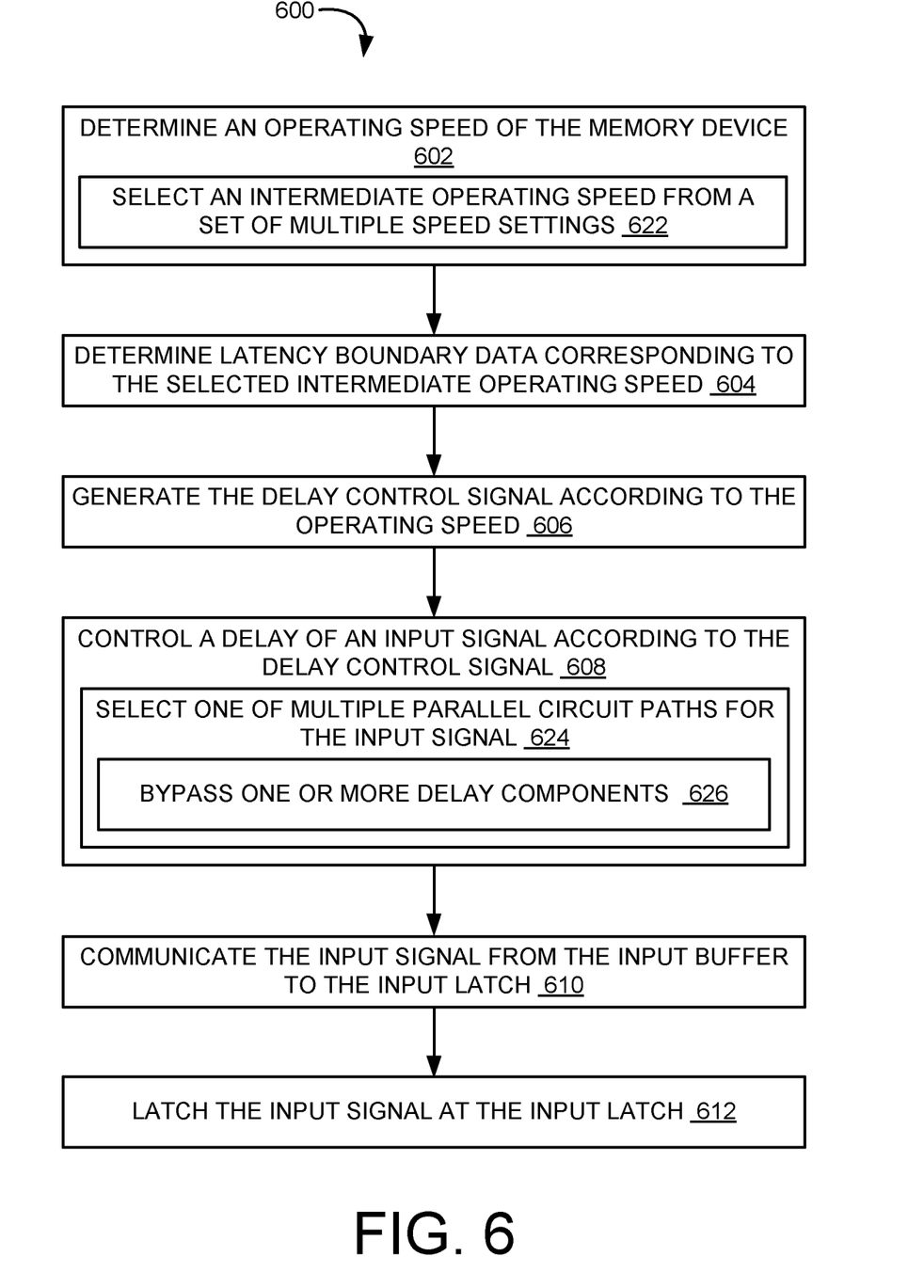
FIG. 6 is a flow diagram illustrating an example method of operating a memory device in accordance with an embodiment of the present technology.

FIG. 6 is a flow diagram illustrating an example method 600 of operating a memory device (e.g., the memory device 100 of FIG. 1) in accordance with an embodiment of the present technology. The method 600 can be for controlling the propagation delay for one or more input signals, such as CA, CS, etc. The method 600 can be for operating the clock tree circuit 200 of FIG. 2, the input buffer 300 of FIG. 3A, the input buffer 350 of FIG. 3B, the control decoder circuit 400 of FIG. 4, the boundary control circuit 500 of FIG. 5, etc.

At block 602, the memory device 100 can determine an operating speed setting (e.g., the mode data 402 of FIG. 4), such as high/full speed operation (e.g., 4.3 Gbps), low speed operation (e.g., 1.6 Gbps), intermediate speed operation (e.g., 3.2 Gbps), etc. The memory device 100 can store the setting for the operating speed in a designated location (e.g., the mode register 180 of FIG. 1 and/or the memory array 150 of FIG. 1). The memory device 100 (e.g., the operation-speed decoder 190 of FIG. 1) can determine the operating speed by accessing the setting stored in the designated location.

In some embodiments, such as at block 622, the memory device 100 can select an intermediate operating speed from a set of multiple speed settings. For example, the memory device 100 can adjust an operating speed for the intermediate speed setting. Also, the memory device 100 can select one of the intermediate operating speeds from a set of possible settings that are between the high/full speed operation and the low speed operation. The memory device 100 can set the intermediate operating speed as a speed (e.g., 3.2 Gbps, 2.7 Gbps, 2.1 Gbps, etc.) between the high/full speed operation and the low speed operation.

At block 604, the memory device 100 can be controlled to set latency boundary data (e.g., the boundary control data 502 of FIG. 5) corresponding to the selected intermediate operating speed. When the intermediate operating speed is variable between multiple intermediate speed settings, the memory device 100 (e.g., operation-speed decoder 190) can be controlled to set the latency boundary data based on accessing a designated location, such as the mode register 180, the memory array 150, etc.

At block 606, the memory device 100 can generate a delay control signal (e.g., delay-control signal 232 of FIG. 2) according to the operating speed (e.g., the mode data 402), the latency boundary data (e.g., the boundary control data 502), etc. The memory device 100 can generate the delay control signal based on inputting the mode data 402 into the control decoder circuit 400. The memory device 100 can further generate the delay control signal according to the speed adjustment data 404 of FIG. 4 that results from inputting the latency boundary data into the boundary control circuit 500. In some embodiments, the memory device 100 can generate the delay control signal when the memory device 100 is set to the intermediate operating speed. When the operating speed is set to full speed or low speed, the delay control signal can be inactive/off.

At block 608, the memory device 100 (e.g., the CS delay 214, the CA delays 216, etc. of FIG. 2) can control a delay of an input signal according to the delay control signal. For example, the address/command input circuit 105 or the input buffer (e.g., the input buffer 300, the input buffer 350, etc.) can receive the delay control signal from the decoder 190. The memory device 100 (e.g., the address/command input circuit 105, the input buffer 300, the input buffer 350, etc.) can control the delay (e.g., propagation delay and/or the RL) of an input signal (e.g., CS, CA, etc.) according to the delay control signal.

In some embodiments, such as at block 624, the memory device 100 can control the delay based on selecting one of multiple parallel circuit paths for propagating the input signal. For example, the memory device 100 (e.g., the input buffer 300, the input buffer 350, etc.) can include a circuit that includes multiple parallel circuit paths (e.g., the first/top circuit path, the second/bottom circuit path, etc.) that each include different number and/or type of components. Accordingly, each of the circuit paths can correspond to a different propagation delay/RL. The memory device 100 can select one of the paths according to the delay control signal. In some embodiments, the memory device 100 can select the path with the shorter propagation delay when the operating speed is set to intermediate speed. In some embodiments, such as at block 625, the memory device 100 can control the delay based on bypassing one or more delay components in communicating the input signal from the input buffer to the input latch.

At block 610, the memory device 100 (e.g., the clock tree circuit 200) can communicate the input signal from the input buffer to the input latch (e.g., the CS latch 222/224, the CA latch 226/228, etc.). The memory device 100 can communicate the input signal through the delay module in communicating the input signal from the input buffer to the input latch. Accordingly, the input signal can correspond to the delay associated with the delay control signal. In controlling the delay, the memory device 100 can match propagation of the input signals with the clock signal. The delay control signal and associated delay control can improve the alignment/timing between the input signals and the clock signal, which can further reduce data processing/latching errors, improve processing speed by reducing the necessary timing window, etc.

At block 612, the memory device 100 (e.g., the CS latch 222/224, the CA latch 226/228, etc.) can latch the input signal for further processing (e.g., read operations, write operations, etc.). The memory device 100 can latch the input signal at the corresponding latch according to the clock signal.

Figure 7:
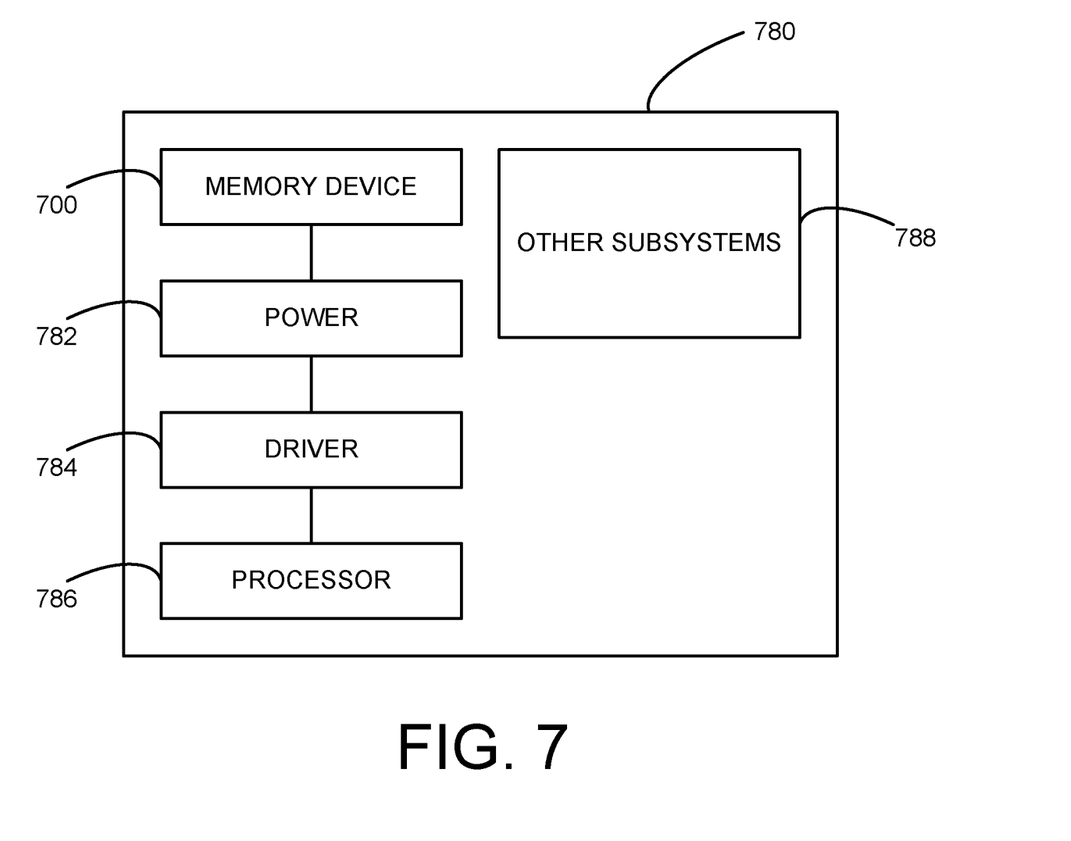
FIG. 7 is a schematic view of a system that includes a memory device in accordance with an embodiment of the present technology.

FIG. 7 is a schematic view of a system that includes a memory device in accordance with embodiments of the present technology. Any one of the foregoing memory devices described above with reference to FIGS. 1-6 can be incorporated into any of a myriad of larger and/or more complex systems, a representative example of which is system 780 shown schematically in FIG. 7. The system 780 can include a memory device 700, a power source 782, a driver 784, a processor 786, and/or other subsystems or components 788. The memory device 700 can include features generally similar to those of the memory device described above with reference to FIGS. 1-6, and can therefore include various features for performing a direct read request from a host device. The resulting system 780 can perform any of a wide variety of functions, such as memory storage, data processing, and/or other suitable functions. Accordingly, representative systems 780 can include, without limitation, hand-held devices (e.g., mobile phones, tablets, digital readers, and digital audio players), computers, vehicles, appliances and other products. Components of the system 780 may be housed in a single unit or distributed over multiple, interconnected units (e.g., through a communications network). The components of the system 780 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the memory devices have been described in the context of devices incorporating DDR based DRAM. Memory devices configured in accordance with other embodiments of the present technology, however, can include other types of suitable storage media in addition to or in lieu of DDR DRAMs, such as NAND or NOR-based storage media, non-volatile storage media, magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-7.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A memory device, comprising:
an internal storage unit configured to store mode data corresponding to an operating speed of the memory device;
a control decoder coupled to the internal storage unit, the control decoder configured to generate a delay control signal based on the mode data; and
an input buffer coupled to the control decoder, the input buffer configured to adjust a delay of an input signal based on the delay control signal, wherein:
the input signal is associated with a timing of a second signal, and
the delay of the input signal is adjusted to maintain the timing when power levels associated with the input signal and the second signal differ.

2. The memory device of claim 1, wherein:
the input buffer includes one or more delay components; and
the input buffer is configured to bypass at least one of the one or more delay components based on the delay control signal.

3. The memory device of claim 2, wherein the input buffer includes a selection circuit configured route the input signal to a first circuit path or a second circuit path according to the delay control signal, wherein the first circuit path and the second circuit path correspond to different propagation delays.

4. The memory device of claim 3, wherein:
the first circuit path includes the one or more delay components and a first output buffer that is configured to output the input signal when the delay control signal corresponds to a first state; and
the second circuit path includes a second output buffer that is configured to receive and output the input signal when the delay control signal corresponds to a second state.

5. The memory device of claim 3, wherein the selection circuit includes a first selection gate and a second selection gate, wherein:
the first circuit path includes the first selection gate operably coupled to the one or more delay components, the first selection gate configured to output the input signal when the delay control signal corresponds to a first state; and
the second circuit path includes the second selection gate that is configured to output the input signal when the delay control signal corresponds to a second state.

6. The memory device of claim 1, wherein the control decoder is configured to generate the delay control signal to bypass one or more delay components when the operating speed is an intermediate speed that is between a high-speed setting and a low-speed setting.

7. The memory device of claim 6, wherein:
an internal storage unit configured to store latency boundary data representing a setting for the intermediate speed among multiple intermediate speed settings, wherein the multiple intermediate speed settings are between the high-speed setting and the low-speed setting; and
the control decoder is configured to generate the delay control signal based on the latency boundary data.

8. The memory device of claim 1, wherein the input signal includes a command signal, an address signal, or a chip select signal.

9. The memory device of claim 1, further comprising:
a clock buffer configured to receive the second signal, wherein the second signal is a clock signal; and
an input latch coupled to the clock buffer and the input buffer, the input latch configured to latch the input signal according to the clock signal.

10. The memory device of claim 9, wherein the delay for the input signal corresponds to a propagation delay of the clock signal.

11. The memory device of claim 9, wherein:
the clock signal corresponds to a first power input;
the input signal corresponds to a second power input; and
the control decoder is configured to generate the delay control signal when the second power input is reduced relative to the second power input.

12. The memory device of claim 1, wherein the internal storage unit includes a memory array, wherein a portion of the memory array is configured to store the mode data.

13. The memory device of claim 1, wherein the internal storage unit includes a mode register configured to store the mode data.

14. The memory device of claim 13, further comprising:
one or more decoders coupled to the input buffer, the one or more decoders configured to process an address, a chip select signal, a command, or a combination thereof;
wherein:
the input buffer comprises an address command input circuit configured to receive the input signal;
the mode register is coupled to the one or more decoders;
the control decoder is coupled to the mode register, the control decoder configured to:
access the mode data stored in the mode register to generate the delay control signal, and
communicate the delay control signal to the address command input circuit.

15. The memory device of claim 1, wherein the memory device comprises a dynamic random-access memory (DRAM).

16. A method of operating a memory device, the method comprising:

determining an operating speed setting of the memory device;
 generating a delay control signal according to the operating speed setting; and
 controlling a delay of an input signal according to the delay control signal, wherein:
  the input signal is associated with a timing of a second signal, and
  the delay of the input signal is adjusted to maintain the timing when power levels associated with the input signal and the second signal differ.

17. The method of claim 16, wherein the input signal includes an address signal, a chip select signal, or a combination thereof.

18. The method of claim 16, wherein controlling the delay includes selecting one of multiple parallel circuit paths for the input signal, wherein each of the multiple parallel circuit paths include different number and/or type of circuit components and provide different propagation delays.

19. The method of claim 16, further comprising:

communicating the input signal from an input buffer to an input latch;

wherein:

controlling the delay includes bypassing one or more delay components in communicating the input signal from the input buffer to the input latch.

20. The method of claim 19, further comprising:

selecting an intermediate operating speed from a set of multiple intermediate speed settings, wherein the multiple intermediate speed settings are between the high-speed setting and the low-speed setting;
 determining latency boundary data corresponding to the selected intermediate operating speed;

wherein:

generating the delay control signal includes generating the delay control signal according to the latency boundary data.

* * * * *